United States Patent
Werber et al.

(10) Patent No.: US 9,214,521 B2
(45) Date of Patent: Dec. 15, 2015

(54) REVERSE CONDUCTING IGBT

(75) Inventors: Dorothea Werber, Munich (DE); Frank Pfirsch, Munich (DE); Hans-Joachim Schulze, Taufkirchen (DE); Carsten Schaeffer, Annenheim (AT); Volodymyr Komarnitskyy, Villach (AT); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 152 days.

(21) Appl. No.: 13/529,185

(22) Filed: Jun. 21, 2012

(65) Prior Publication Data
US 2013/0341674 A1 Dec. 26, 2013

(51) Int. Cl.
*H01L 29/66* (2006.01)
*H01L 29/739* (2006.01)
(Continued)

(52) U.S. Cl.
CPC ............ *H01L 29/32* (2013.01); *H01L 29/0619* (2013.01); *H01L 29/167* (2013.01); *H01L 29/423* (2013.01); *H01L 29/7395* (2013.01); *H01L 29/7397* (2013.01); *H01L 29/7811* (2013.01); *H01L 29/8611* (2013.01); *H01L 21/26506* (2013.01); *H01L 29/0634* (2013.01); *H01L 29/0692* (2013.01); *H01L 29/0696* (2013.01); *H01L 29/1095* (2013.01); *H01L 29/402* (2013.01); *H01L 29/41766* (2013.01)

(58) Field of Classification Search
CPC ............ H01L 29/1095; H01L 29/0878; H01L 2924/13055; H01L 29/7395
USPC ................................. 257/139, 140
See application file for complete search history.

(56) References Cited

U.S. PATENT DOCUMENTS 4,855,799 A * 8/1989 Tanabe et al. .................. 257/341
5,360,984 A * 11/1994 Kirihata .......................... 257/143
(Continued)

FOREIGN PATENT DOCUMENTS

DE 102005018366 A1 11/2005
DE 102010043567 A1 6/2011
JP 2008004866 A 1/2008

OTHER PUBLICATIONS

Rahimo et al. "The Bi-mode Insulated Gate Transistor (BIGT) A Potential Technology for Higher Power Applications." Proceedings of the 20th International Symposium on Power Semiconductor Devices & ICs. May 18-22, 2008. Oralando, FL. pp. 68-71.
(Continued)

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

A semiconductor device includes a first emitter region of a first conductivity type, a second emitter region of a second conductivity type complementary to the first type, a drift region of the second conductivity type, and a first electrode. The first and second emitter regions are arranged between the drift region and first electrode and each connected to the first electrode. A device cell of a cell region includes a body region of the first conductivity type adjoining the drift region, a source region of the second conductivity type adjoining the body region, and a gate electrode adjacent the body region and dielectrically insulated from the body region by a gate dielectric. A second electrode is electrically connected to the source and body regions. A parasitic region of the first conductivity type is disposed outside the cell region and includes at least one section with charge carrier lifetime reduction means.

22 Claims, 5 Drawing Sheets

(51) Int. Cl.
  *H01L 29/32*  (2006.01)
  *H01L 29/861* (2006.01)
  *H01L 29/06*  (2006.01)
  *H01L 29/423* (2006.01)
  *H01L 29/78*  (2006.01)
  *H01L 29/167* (2006.01)
  *H01L 21/265*  (2006.01)
  *H01L 29/40*   (2006.01)
  *H01L 29/417*  (2006.01)
  *H01L 29/10*   (2006.01)

(56) References Cited

U.S. PATENT DOCUMENTS

| | | | |
|---|---|---|---|
| 5,430,314 A | 7/1995 | Yilmaz | |
| 5,512,777 A * | 4/1996 | Endo | 257/617 |
| 5,702,961 A * | 12/1997 | Park | 438/138 |
| 8,030,702 B2 * | 10/2011 | Hsieh | 257/330 |
| 8,080,853 B2 * | 12/2011 | Tsuzuki et al. | 257/370 |
| 2004/0043565 A1 * | 3/2004 | Yamaguchi et al. | 438/268 |
| 2008/0179671 A1 * | 7/2008 | Saito et al. | 257/341 |
| 2008/0315297 A1 * | 12/2008 | Takashita et al. | 257/328 |
| 2009/0052230 A1 * | 2/2009 | Rajendran et al. | 365/163 |
| 2009/0242931 A1 | 10/2009 | Tsuzuki et al. | |
| 2010/0289059 A1 * | 11/2010 | Hsieh | 257/140 |

OTHER PUBLICATIONS

Rahimo et al."A High Current 3300V Module Employing Reverse Conducting IGBTs Setting a New Benchmark in Output Power Capability." Proceedings of the 20th International Symposium on Power Semiconductor Devices & ICs. May 18-22, 2008. Oralando, FL. pp. 283-286.

* cited by examiner

REVERSE CONDUCTING IGBT

TECHNICAL FIELD

Embodiments of the present invention relate to an IGBT (Insulated Gate Bipolar Transistor), and in particular to a reverse conducting IGBT (RC-IGBT).

BACKGROUND

An RC-IGBT includes a gate terminal, a collector terminal (drain terminal), and an emitter terminal (source terminal). An RC-IGBT can be operated in a forward biased mode, which is when an internal pn-junction between a body region and a drift region of the RC-IGBT is reverse biased, and in a reverse biased mode, which is when the pn-junction is forward biased. In the forward biased mode, the RC-IGBT only conducts a current when a suitable drive potential is applied to the gate terminal, while in the reverse biased mode, the RC-IGBT conducts a current independent of the control of the gate terminal. In the reverse biased mode, the RC-IGBT operates like a diode that may cause reverse-recovery losses when the RC-IGBT switches from the reverse biased mode, which is when the body diode is conducting, to the forward-biased mode, which is when the body diode is reverse biased. It is basically desirable to reduce those reverse recovery losses.

SUMMARY

A first embodiment relates to a semiconductor device. The semiconductor device includes a first emitter region of a first conductivity type, a second emitter region of a second conductivity type complementary to the first conductivity type, a drift region of the second conductivity type, and a first electrode. The first emitter region and the second emitter region are arranged between the drift region and the first electrode and the first and second emitter regions are connected to the first electrode. The semiconductor device further includes at least one device cell, with the at least one device cell including a body region of the first conductivity type adjoining the drift region, a source region of the second conductivity type adjoining the body region, and a gate electrode adjacent the body region and dielectrically insulated from the body region by a gate dielectric. A second electrode is electrically connected to the source region and the body region of the at least one device cell. Further, a parasitic region of the first conductivity type is disposed outside the cell region. The parasitic region includes at least one section with charge carrier lifetime reduction means.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following detailed Description, reference is made to the accompanying drawings, which form a part thereof, and in which are shown by way of illustration specific embodiments in which the invention may be practiced.

Figure 1:
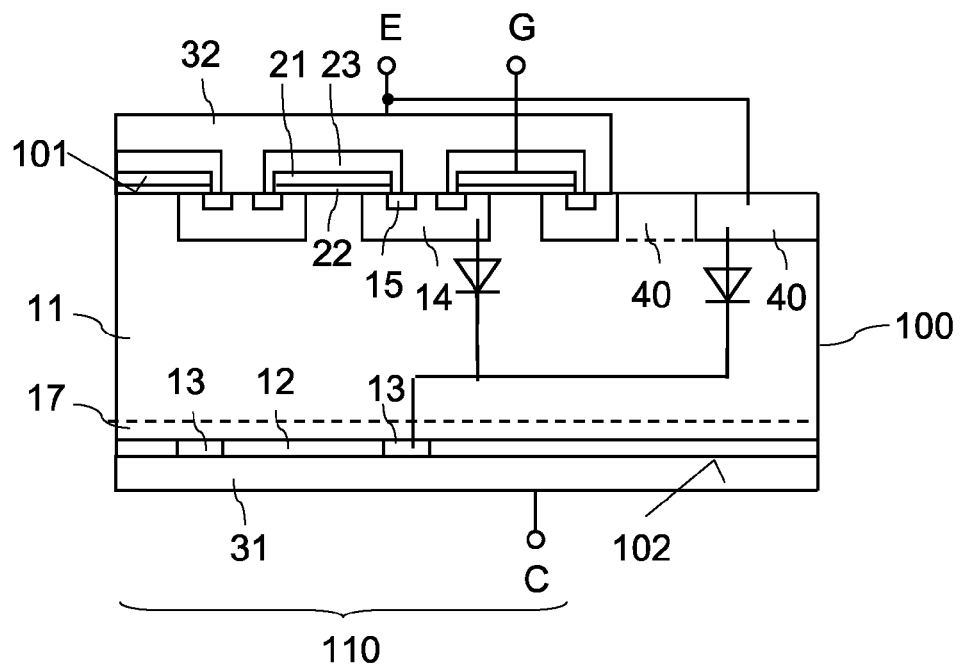
FIG. 1 illustrates a cross sectional view of a semiconductor device including first and second emitter regions, a drift region, device cells and at least one parasitic device region according to a first embodiment.

FIG. 1 illustrates a vertical cross sectional view of a semiconductor device, in particular of a semiconductor device including an IGBT (Insulated Gate Bipolar Transistor). The semiconductor device includes a semiconductor body 100 with a first surface 101 and a second surface 102 opposite the first surface 101. The semiconductor body 100 may include a conventional semiconductor material, such as silicon (Si), gallium arsenide (GaAs), or the like. FIG. 1 illustrates a cross section in a vertical plane of the semiconductor body 100, which is a plane perpendicular to the first and second surfaces 101, 102.

Referring to FIG. 1, the semiconductor device includes a first emitter region 12 of a first conductivity type and at least one second emitter region 13 of a second conductivity type complementary to the first conductivity type. The first and second emitter regions 12, 13 are each electrically connected to a first electrode 31. The first electrode 31 forms a collector terminal (drain terminal) C of the semiconductor device (the IGBT) or is electrically connected to such a collector terminal C. The semiconductor device further includes a drift region 11 of the second conductivity type. The drift region 11 is spaced apart from the first electrode 31 by the first and second emitter regions 12, 13 which are each located between the drift region 11 and the first electrode 31. The drift region 11 may adjoin the first and second emitter regions 12, 13 (as illustrated). Optionally, a field-stop region 17 (illustrated in dashed lines) of the second conductivity type and more highly doped than the drift region 11 is arranged between the drift region 11 and the first and second emitter regions 12, 13. The doping concentration of the drift region 11 is, for example, between $10^{12}$ (1E12) $cm^{-3}$ and $10^{14}$ (1E14) $cm^{-3}$. The doping concentrations of the first and second emitter regions 12, 13 are, for example, between $10^{16}$ (1E16) $cm^{-3}$ and $10^{21}$ (1E21) $cm^{-3}$.

Referring to FIG. 1, the semiconductor device further includes a cell region 110 with at least one device cell or transistor cell. In the embodiment illustrated in FIG. 1 the cell region 110 includes a plurality of device cells. Each device cell includes a body region 14 of the first conductivity type and a source region 15 of the second conductivity type. The body region 14 adjoins the drift region 11 so that a pn-junction is formed between the body region 14 and the drift region 11. The source region 15 is spaced apart from the drift region 11 by the body region 14. Each device cell further includes a gate electrode 21 adjacent the body region 14 and dielectrically insulated from the body region 14 by a gate dielectric 22. The gate electrode 21 extends from the source region 15 to a section of the drift region 11 along the body region 14 so that the gate electrode 21 is capable of controlling a conducting channel in the body region 14 between the source region 15 and the drift region 11 along the gate dielectric 22. The source regions 15 and the body regions 14 of the individual device cells are electrically connected to a second electrode 32. The second electrode 32 is dielectrically insulated from the gate electrode 21 by an insulating material 23, and forms an emitter terminal (source terminal) E of the semiconductor device (the IGBT) or is electrically connected to the emitter terminal E. The gate electrodes 21 of the individual device cells are electrically connected to a gate terminal G (only schematically illustrated in FIG. 1).

In the embodiment of FIG. 1, the gate electrodes 21 of the individual device cells are planar electrodes located above the first surface 101 of the semiconductor body 100. According to one embodiment, the individual device cells share one planar gate electrode that has openings in which the second electrode 32 is electrically connected to the source and body regions 14, 15 of the individual device cells.

The first and second emitter regions 12, 13, the drift region 11 and the device cells with the body regions 14, the source regions 15 and the gate electrodes 21 form an IGBT, in particular a reverse conducting (RC) IGBT (RC-IGBT). The basic operating principle of the RC-IGBT is explained in the following. For explanation purposes it is assumed that the semiconductor regions of the first conductivity type, such as the first emitter region 12 and the body regions 14, are p-type semiconductor regions, while the semiconductor regions of the second conductivity type, such as the second emitter region 13, the drift region 11 and the source regions 15, are n-type semiconductor regions. However, this is only an example. According to a further embodiment, the semiconductor regions of the first conductivity type are n-type semiconductor regions and the semiconductor regions of the second conductivity type are p-type semiconductor regions.

The RC-IGBT can be operated in a forward biased mode (forward biased state) and in a reverse biased mode (reverse biased state). The RC-IGBT is in the forward biased state when a voltage is applied between the collector and the emitter terminals C, E that reverse biases the pn-junction between the body region 14 and the drift region 11. This voltage is a positive voltage when the drift region 11 is an n-type region and the body region 14 is a p-type region. In the forward biased mode, the RC-IGBT can be switched on and off by applying a suitable drive potential to the gate terminal G. The RC-IGBT is switched on when the drive potential applied to the gate terminal G causes an inversion channel in the body region 14 between the source region 15 and the drift region 11. In the on-state the first emitter region 12 injects p-type charge carriers (holes) into the drift region 11 and the source regions 15 inject n-type charge carriers (electrons) via the conducting channel in the body region 14 into the drift region 11. These charge carriers injected into the drift region 11 form a charge carrier plasma resulting in a low on-resistance of the RC-IGBT.

When the RC-IGBT is forward biased and the conducting channel in the body region 14 is interrupted, the RC-IGBT is in the off-state. In the off-state, the voltage applied between the collector and emitter terminals C, E causes a depletion region (space charge region) to expand in the drift region 11 starting at the pn-junction between the drift region 11 and the body regions 15 of the individual device cells. The voltage blocking capability of the RC-IGBT is the maximum voltage the RC-IGBT is capable to sustain before an avalanche breakdown occurs. The voltage blocking capability is, inter alia, dependent on the doping concentration of the drift region 11 and the length of the drift region 11, which is the shortest distance between the body regions 14 and the first and second emitter regions 12, 13 or the field stop region 17, respectively.

In the reverse biased mode, a voltage applied between the collector and the emitter terminals C, E forward biases the pn-junction between the body region 14 and the drift region 11. In this operation mode, the body regions 14, the drift region 11 and the second emitter regions 13 form a diode that conducts a current even when the channel in the body region 14 between the source region 15 and the drift region 11 is interrupted. The circuit symbol of this diode is schematically illustrated in FIG. 1. This diode will be referred to as body diode or reverse diode in the following.

The RC-IGBT of FIG. 1 can be used as an electronic switch that is capable of switching on and switching off a current flowing in a first direction when the RC-IGBT is forward biased, while the RC-IGBT always conducts a current flowing in a second direction opposite to the first direction when the RC-IGBT is reverse biased. There is a wide range of circuit applications in which it is desirable to employ a semiconductor switch having this capability.

In the reverse operation mode of the RC-IGBT, p-type charge carriers (holes) are injected into the drift region 11 by the body regions 14, while n-type charge carriers (electrons) are injected into the drift region 11 by the second emitter region 13. These charge carriers form a charge carrier plasma in the drift region 11. When the RC-IGBT switches from the reverse biased mode to the off-state in the forward biased mode, this charge carrier plasma has to be removed from the drift region 11 before the RC-IGBT blocks. In other words, the RC-IGBT may conduct a current after it has been forward biased until the charge carrier plasma has been removed from the drift region 11. The process of removing the charge carrier plasma from the drift region 11 of the RC-IGBT is commonly known as reverse recovery. Losses that may occur in this process are known as reverse recovery losses.

The reverse recovery losses occurring in the cell region 110 of the RC-IGBT can be reduced by driving the gate terminal G such that a conducting channel is generated in the body region 14 between the source region 15 and the drift region 11 before the RC-IGBT is forward biased. As soon as the conducting channel is opened, electrons can bypass the body regions 14 and therefore the injection of holes into the drift region 11 is reduced. Thus, the concentration of stored charge carriers in the drift region 11 is reduced. In this way, the RC-IGBT in the reverse biased mode switches from a bipolar operation mode, in which electrons and holes are injected into the drift region 11, to an operation mode in which only a low concentration of holes is injected into the drift region 11 or even to an operation mode, in which only electrons are injected into the drift region 11. These operation modes, in which only a low concentration of holes is injected or in which only electrons are injected, will be referred to as "unipolar mode" or "reverse biased unipolar mode" in the following. Just before the RC-IGBT switches from the reverse biased unipolar operation mode to the off-state in the forward biased mode, the gate terminal G is driven such that the conducting channel is interrupted in order to prevent a short circuit when, e.g., the RC-IGBT is used in a half-bridge configuration. When switching from the reverse biased unipolar mode to the off-state much fewer charge carriers have to be removed from the drift region 11 before the semiconductor device blocks than in the case when the RC-IGBT would switch from the reverse biased bipolar operation mode to the off-state. Thus, reverse recovery losses are reduced when the semiconductor device is operated such that it switches from the reverse biased unipolar operation mode to the off-state.

Besides the body regions 14 connected to the second electrode 32, the semiconductor device may include one or more semiconductor device regions 40 of the first conductivity type that are either connected to the second electrode 32 or the emitter terminal E, respectively (as illustrated in FIG. 1), or that are floating. This semiconductor region 40 is none of the active device regions, in particular none of the body regions, and will be referred to as "parasitic region" in the following. There may be several reasons to provide such a parasitic region 40, wherein some of these reasons will be explained with reference to examples herein below.

The parasitic region 40 is located outside the cell region 110 and is spaced apart from at least the body regions 14 of those device cells that are not edge device cells. The "edge device cells" are those device cells that are located along an edge of the cell region 110. According to one embodiment, the parasitic region 40 is also spaced apart from those cell regions located along the edge of the cell region 110 (as illustrated in solid lines in FIG. 1). According to a further embodiment, the parasitic region 40 adjoins the body region 14 of at least one edge device cell region (as illustrated in dashed lines in FIG. 1).

The drift region 11 has a length in a current flow direction. The "current flow direction" is the direction in which charge carriers flow through the drift region 11 when the semiconductor device is in an on-state. In the semiconductor device of FIG. 1, the current flow direction corresponds to the vertical direction of the semiconductor body 100. According to one embodiment, the second emitter region 13 is distant to the at least one parasitic region 40 in a direction perpendicular to the current flow direction, which is a lateral direction of the semiconductor body 100 in the present embodiment. According to one embodiment, the distance is at least one time the length of the drift region 11, 1.5 times the length of the drift region 11, 2 times the length of the drift region 11, or more.

The parasitic region 40 together with the drift region 11 and the second emitter region 13 forms another diode between the emitter and collector terminals C, E. A circuit symbol of this diode is also illustrated in FIG. 1. When the RC-IGBT is in the reverse biased mode, this further diode, like the diodes formed by the second emitter region 13, the drift region 11 and the body regions 14, is forward biased so that p-type charge carriers (holes) are injected into the drift region 11 by the parasitic region 40. Unlike the body regions 14, the emission of holes from the parasitic region 40 into the drift region 11 cannot be decreased or suppressed by opening the conducting channel in the body region 14 between the source region 15 and the drift region 11, so that reverse recovery losses occurring in this further diode cannot be reduced in the same way as recovery losses occurring in the body diodes formed through the second emitter regions 13, the drift region 11 and the body regions 14. A similar effect occurs when the parasitic region 40 is floating. In this case, the parasitic region 40 is coupled to the body region 14 through a section of the drift region 11 and may draw a current from the body region 14, resulting in an injection of charge carriers from the parasitic region 40 into the drift region 11.

In order to reduce reverse recovery losses that may occur when charge carriers are injected from the parasitic region 40 into the drift region 11, the parasitic region 40, or at least one section of the parasitic region 40, includes charge carrier lifetime reduction means that reduce the charge carrier lifetime of electrons and holes in the parasitic region 40. When the RC-IGBT is in the reverse biased mode, the parasitic region 40 acts as an emitter that injects p-type charge carriers into the drift region 11. The charge carrier lifetime reduction means reduce the efficiency of this emitter so that the injection of charge carriers into the drift region 11 is reduced. Thus, the concentration of charge carriers in the charge carrier plasma resulting from the parasitic region 40 is reduced, so that reverse recovery losses are reduced when the RC-IGBT switches from the reverse biased mode to the forward biased mode.

Different embodiments of charge carrier reduction means are explained with reference to FIGS. 2 to 4 below. These figures each illustrate a vertical cross sectional view of one parasitic region 40. The charge carrier reduction means explained with one of FIGS. 2 to 4 below may be combined with one or more of the charge carrier reduction means explained with reference to the other figures. The charge carrier reduction means may be configured such that the charge carrier lifetime, in those sections where the charge carrier reduction means are implemented, is at least one of less than 100 ns, less than 10% of a charge carrier lifetime in the drift region 11, and less than in the body region 14.

The charge carrier reduction means may be distributed all over the parasitic region 40. According to a further embodiment, the charge carrier reduction means are only included in a section of the parasitic region 40 that is distant to the drift region 11 and, when the parasitic region 40 adjoins the body region 14, that is distant to the body region 14.

Figure 2:
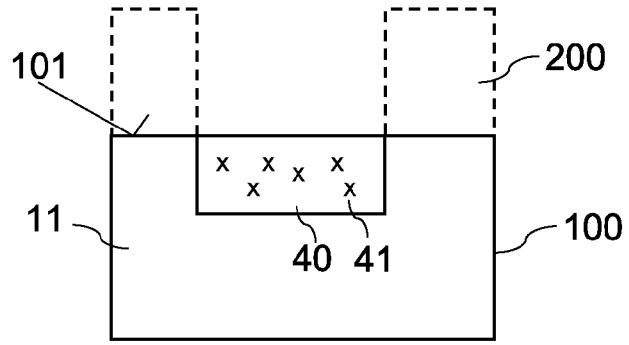
FIG. 2 illustrates a cross sectional view of the parasitic device region according to a first embodiment.

Referring to FIG. 2, the charge carrier lifetime reduction means may include recombination centers 41 induced by irradiating the parasitic region 40 with particles. These particles may be non-doping particles, such as helium ions, carbon atoms, argon atoms, semiconductor atoms, such as silicon atoms, oxygen atoms, or electrons, or the like. However it is also possible to implant doping particles, such as p-type or n-type doping particles that are not activated. Further, protons may be implanted. Irradiating the parasitic region 40 induces crystal defects or defect complexes that act as recombination centers. These crystal defects or defect complexes include, for example, double voids or A-centers.

At the recombination centers 41 p-type charge carriers can recombine with electrons so as to reduce the charge carrier lifetime of the charge carriers in the parasitic region 40. Producing the recombination centers 41 may include implanting the particles via the first surface 101 into the parasitic region 40. Implanting the particles may include using a mask 200 arranged on the first surface 101. The mask 200 has an opening above the parasitic region 40 so that the mask 200 may prevent particles from being implanted into regions other than the parasitic region 40.

Producing the recombination centers 41 may further include a temperature process in which at least the parasitic region 40 is heated up to a temperature at which the crystal defects are stabilized. The temperature of such an annealing process is, for example, between 220° C. and 450° C., the duration of the annealing process is, for example, between several seconds and several hours.

According to a further embodiment, doping particles of a doping type complementary to the doping of the parasitic region 40 are implanted. These doping particles reduce the effective doping concentration of the parasitic region 40 but, due to the increased number of doping atoms and remaining crystal defects in the parasitic region 40 reduce the charge carrier lifetime.

The vertical position of the recombination centers 41 (corresponding to the distance between the crystal defects 41 and the first surface 101) can be adjusted through the implantation energy at which the particles are implanted. According to one embodiment, the implantation process uses several different implantation energies in order to generate recombination centers 41 at different vertical positions.

Dependent on the type of particles that are implanted the geometry and the type of the mask 200 may vary. When, for example, electrons are implanted the mask 200 may even cover the parasitic region 40, but may have a lower thickness above the region 40 so that electrons may pass through the mask 200 into the parasitic region 40, while in other regions the mask 200 has a higher thickness so that electrons cannot pass through the mask 200 into these other regions.

Alternatively or additionally to recombination centers 41 including crystal defects, recombination centers 41 including heavy metal atoms may be present in the parasitic region 40. Those heavy metal atoms also act as recombination centers and, therefore, help to reduce the charge carrier lifetime in the parasitic region 40. Suitable heavy metal atoms are, for example, titanium atoms, molybdenum atoms, tungsten atoms, gold, platinum or palladium atoms, and the like. These atoms can be implanted into the parasitic region 40 similar to the implantation of the particles forming crystal defects.

Figure 3:
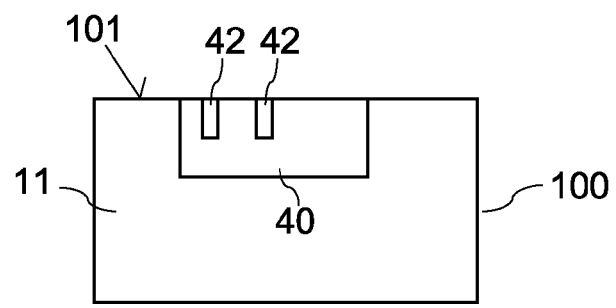
FIG. 3 illustrates a cross sectional view of the parasitic device region according to a second embodiment.

According to a further embodiment, illustrated in FIG. 3, the parasitic region 40 includes at least one trench extending from the first surface 101 into the parasitic region 40. The at least one trench is filled with a filling material 42 that forms an interface with the surrounding semiconductor material of the parasitic region 40. The filling material 42 is selected such that p-type charge carriers in the parasitic region 40 may efficiently recombine with electrons at the interface. According to one embodiment, the filling material 42 is an oxide, such as a silicon oxide ($SiO_2$). In this case, there are crystal defects at the interface between the oxide and the surrounding semiconductor material that act as recombination centers. According to a further embodiment, the trenches are filled with an electrically conductive material, such as a metal or a metal-semiconductor alloy, such as a silicide, forming an ohmic contact with the semiconductor material of the parasitic region 40. The filing material 42 in this case can include, for example, a metal, such as aluminum, copper, titanium, tungsten, metal alloys like AlCu or TiW, metal-silicon alloys, such as AlSi or AlSiCu, or silicides, such as $CoSi_2$, $HfSi_2$, $MoSi_2$, $PdSi_2$, PtSi, $TaSi_2$, $TiSi_2$, $ZrSi_2$, $NiSi_2$. The filling material 42 may also include as a first layer a barrier layer including, e.g., TiN or TiW.

According to one embodiment, the filling material 42 includes a heavy metal, such as one of the heavy metals explained with reference to FIG. 2 before, and includes heavy metal atoms in the parasitic region 40 that are diffused into the parasitic region 40 from the filling material 42. Producing the diffused heavy metal atoms may include a diffusion process in which the atoms diffuse from the filling material 42 into the surrounding semiconductor material of the parasitic region 40.

When the RC-IGBT is forward biased and switched off, the pn-junctions between the drift region 11 and the body regions 14 as well as the pn-junction between the drift region 11 and the parasitic region 40 are reverse biased so that a depletion region occurs. The depletion region mainly expands in the drift region 11 that usually has a lower doping concentration than the body regions 14 and the parasitic region 40. However, the depletion region also expands in the body regions 14 and the parasitic region 40. How deep the depletion region expands into the parasitic region 40 from the pn-junction is dependent on the doping concentration of the parasitic region 40 and is dependent on the voltage applied between the collector and the emitter terminals C, E, when the RC-IGBT is in the off-state. According to one embodiment, the vertical position of the recombination centers 41, or the depths of the trenches with the filling (recombination) material 42 are selected such that the depletion region does not reach the recombination centers 41, or the filling material 42 when a voltage corresponding to the voltage blocking capability of the RC-IGBT is applied between the collector and the emitter terminals C, E. The voltage blocking capability corresponds to the maximum voltage that can be applied between the collector and the emitter terminals before an avalanche breakthrough sets in.

Figure 4:
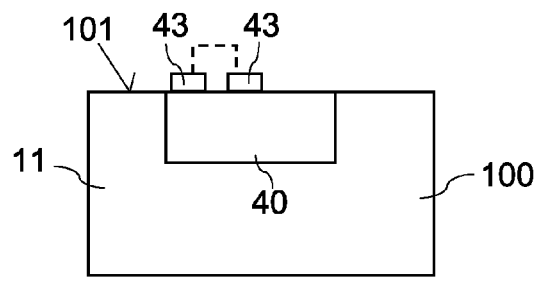
FIG. 4 illustrates a cross sectional view of the parasitic device region according to a further embodiment.

According to a further embodiment, illustrated in FIG. 4, at least one recombination region 43 including a recombination material is provided on the parasitic region 40 on the first surface 101. These recombination regions 43, like the filling material 42 regions of FIG. 3, are floating regions. Thus, the recombination region 43 is electrically connected to the parasitic region 40 but is not electrically connected to other regions or terminals of the RC-IGBT. According to one embodiment, there is an ohmic contact between the recombination region 43 and the parasitic region 40. This ohmic contact provides for an efficient recombination of p-type charge carriers 40 with electrons at the interface between the recombination region 43 and the parasitic region 40. In the embodiment of FIG. 4, there are two contact regions 43 arranged on the first surface 101. However, this is only an example, an arbitrary number of recombination regions 43 may be provided on the first surface 101.

According to a further embodiment, the at least one contact region is located in a trench in the parasitic region 40, similar to the trenches explained with reference to FIG. 3.

According to one embodiment, an integral of the doping concentration of the parasitic region 40 between the recombination region 43 and the drift region 11 is at least $1 \cdot 10^{12}$ (1E12) $cm^{-2}$ The recombination region 43 includes, for example, a metal, such as aluminum, copper, metal alloys, metal-silicon alloys, such as AlSi or AlSiCu, or silicides, such as $CoSi_2$, $HfSi_2$, $MoSi_2$, $PdSi_2$, PtSi, $TaSi_2$, $TiSi_2$, $ZrSi_2$, $NiSi_2$. The recombination region 43 may be produced using the same processes used for producing the electrical contact between the second electrode 32 and the body regions 14 and/or the parasitic region 40 with the difference, that the at least one recombination region 43 is not electrically connected to the second electrode 32.

When several recombination regions 43 are provided, these several recombination regions 43 may be electrically connected with each other. This is schematically illustrated in dashed lines in FIG. 4.

The parasitic region 40 may serve different purposes, some of which will be explained with reference to FIGS. 5 to 12 herein below.

Figure 5:
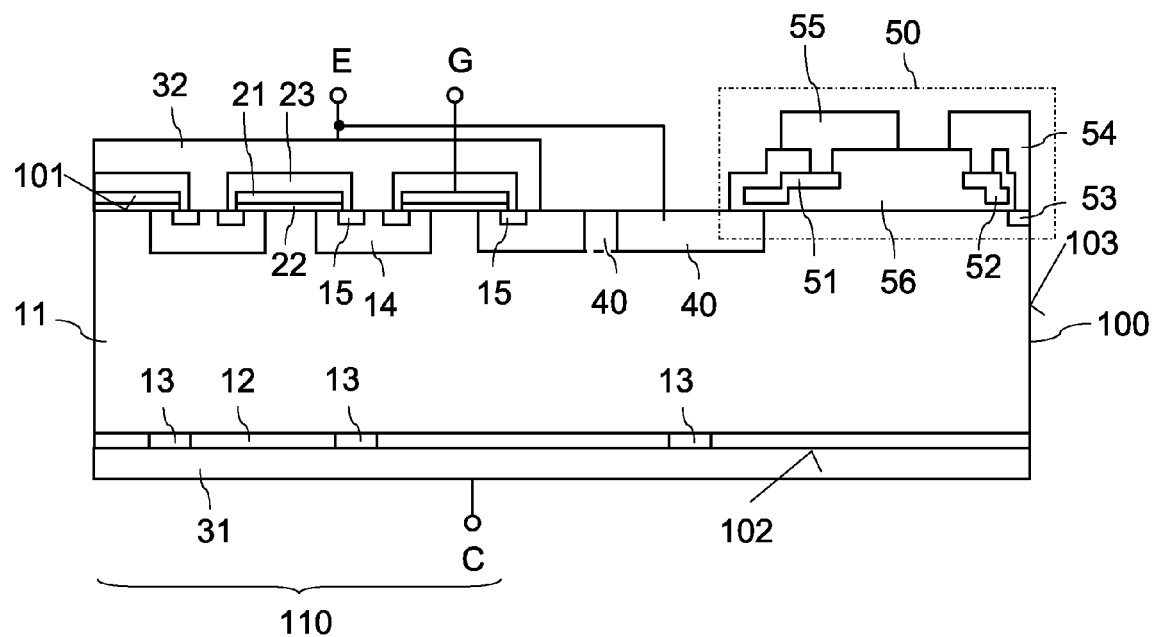
FIG. 5 illustrates a cross sectional view of a semiconductor device according to a second embodiment.
Figure 6:
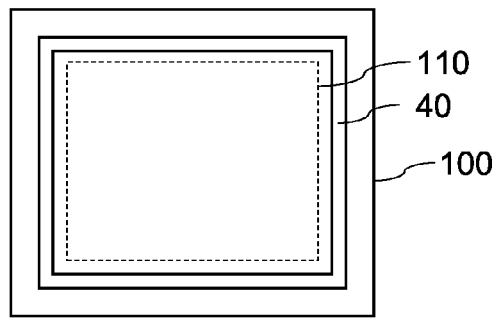
FIG. 6 illustrates a first horizontal cross sectional view of a semiconductor device.

FIG. 5 illustrates a vertical cross sectional view of an RC-IGBT having a topology as explained with reference to FIG. 1. In the RC-IGBT of FIG. 5, the parasitic region 40 is part of an edge termination structure. Referring to FIG. 6, that illustrates a horizontal cross sectional view of the RC-IGBT of FIG. 5, the parasitic region 40 can be ring-shaped and surround the cell region 110 (that is only schematically illustrated in FIG. 6). Referring to FIG. 5, the edge termination structure may additionally include a field-plate arrangement 50 with at least one field-plate. In the embodiment of FIG. 5, the field-plate arrangement 50 includes a first field plate 51 above the first surface 101 and dielectrically insulated from the semiconductor body 100 by an insulation layer 56, and electrically connected to a terminal 55 for a reference potential. The terminal 55 for the reference potential may be either connected to the emitter (source) terminal E or to the gate terminal G. However, those connections are not illustrated in FIG. 5. The field-electrode arrangement 50 of FIG. 5 further includes a second field electrode 52 that is electrically connected to the semiconductor body 100 close to an edge 103 of the semiconductor body 100. The edge 103 terminates the semiconductor body in the horizontal direction. The second field electrode 52 is closer to the edge 103 than the first field electrode 51 and is electrically connected to the semiconductor body 100 through an electrical contact 54. In the embodiment of FIG. 5, the electrical contact 54 is connected to a contact region 53 adjoining the first surface 101. The contact region 53 is a semiconductor region of either the first conductivity type or the second conductivity type and has a higher doping concentration than the drift region 11. Like the parasitic region 40, the field-electrode arrangement 50, that is not illustrated in FIG. 6, may be ring-shaped and surround the cell region 110 with the individual transistor cells.

Figure 9:
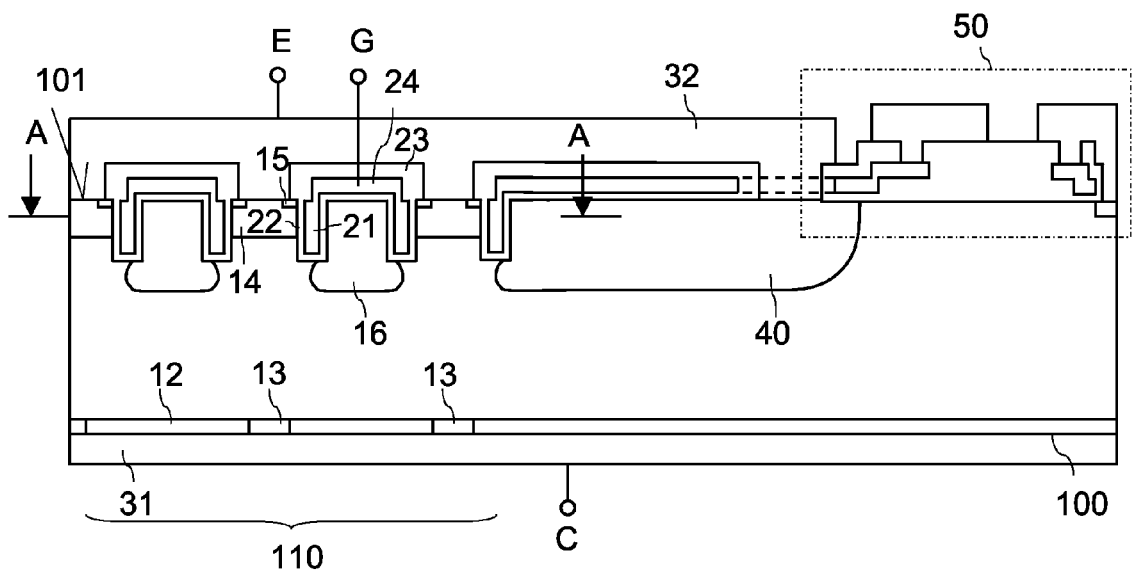
FIG. 9 illustrates a cross sectional view of a semiconductor device according to a fourth embodiment.

Instead of a field-plate arrangement illustrated, e.g., in FIGS. 5 and 9 the edge termination structure may include other well-known edge termination structures (not shown).

Figure 7:
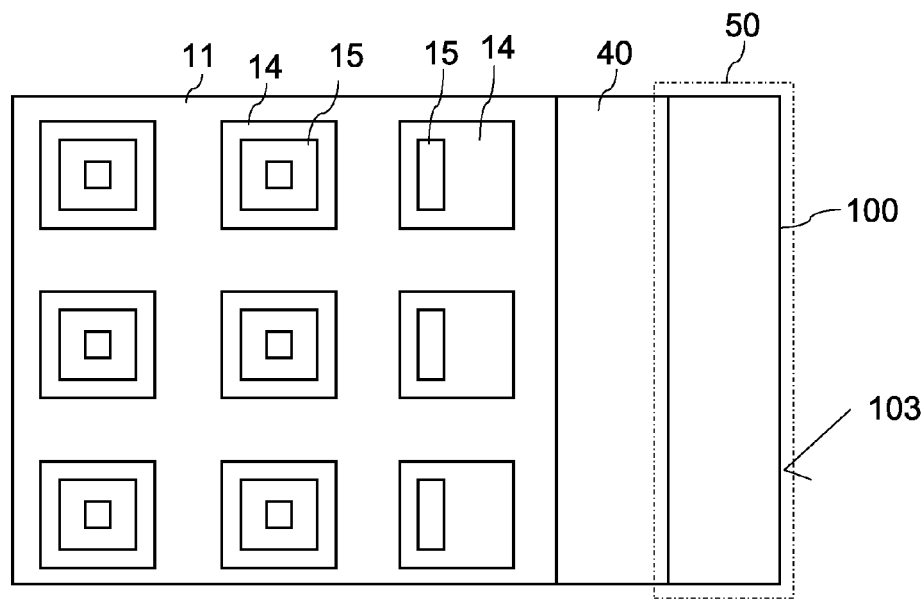
FIG. 7 illustrates a second horizontal cross sectional view of a semiconductor device.

The geometry (shape) of the individual transistor cells is mainly defined by the shape of the body region 14. According to one embodiment, the individual transistor cells are rectangular transistor cells with body regions 14 having a rectangular shape in the horizontal plane. FIG. 7 illustrates a horizontal cross sectional view of an embodiment of the RC-IGBT of FIG. 5 having rectangular transistor cells. In the cross section of FIG. 7, a section of the cell region 110, of the parasitic region 40, and of the field-plate arrangement 50 is illustrated. Referring to FIG. 7, the individual body regions 14 may be rectangular regions. However, this is only an example. According to a further embodiment (not illustrated) the body regions 14 are hexagonal regions, elliptical regions, circular regions, or elongated regions.

Figure 8:
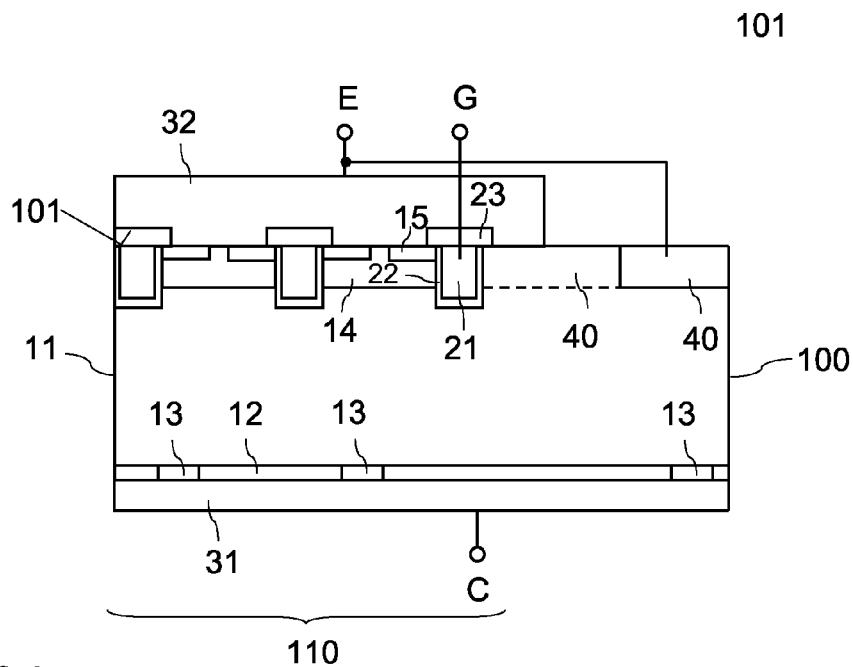
FIG. 8 illustrates a vertical cross sectional view of a semiconductor device according to a third embodiment.

The use of a parasitic region that includes charge carrier lifetime reduction means is not limited to RC-IGBTs with a planar gate electrode 21 as explained with reference to FIGS. 1 and 5. FIG. 8 illustrates a vertical cross sectional view of an RC-IGBT according to a further embodiment. In this embodiment, the gate electrode 21 is a trench electrode and is arranged in a trench extending from the first surface 101 into the semiconductor body 100. In the horizontal plane, the gate electrode 21 may have the shape of a rectangular or hexagonal grid, so that the body regions 14 are rectangular or hexagonal semiconductor regions, accordingly.

Figure 10:
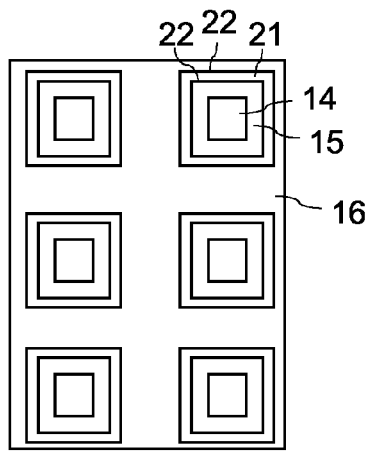
FIG. 10 illustrates a horizontal cross sectional view of a cell region of a semiconductor device.

FIG. 9 illustrates a vertical cross sectional view of an RC-IGBT according to a further embodiment. FIG. 10 illustrates a horizontal cross sectional view of the RC-IGBT of FIG. 9 in the cell region. In this embodiment, the gate electrode 21 is a trench electrode with a plurality of ring-shaped sections that each surround the body region 14 of one transistor cell. In the embodiment illustrated in FIG. 10, the ring-shaped sections of the gate electrode 21 are rectangular. However, this is only an example, these sections could also be hexagonal, circular, elliptical, or the like. Between the gate electrode sections 21 of the individual transistor cells floating semiconductor regions 16 of the first conductivity are arranged. The gate electrode sections 21 of neighboring transistor cells are electrically connected through conductors 24 arranged above the first surface 101 of the semiconductor body 100. In the semiconductor device of FIG. 9, the parasitic region 40 is again part of an edge termination structure and is electrically connected to the second electrode 32 in this embodiment.

Figure 11:
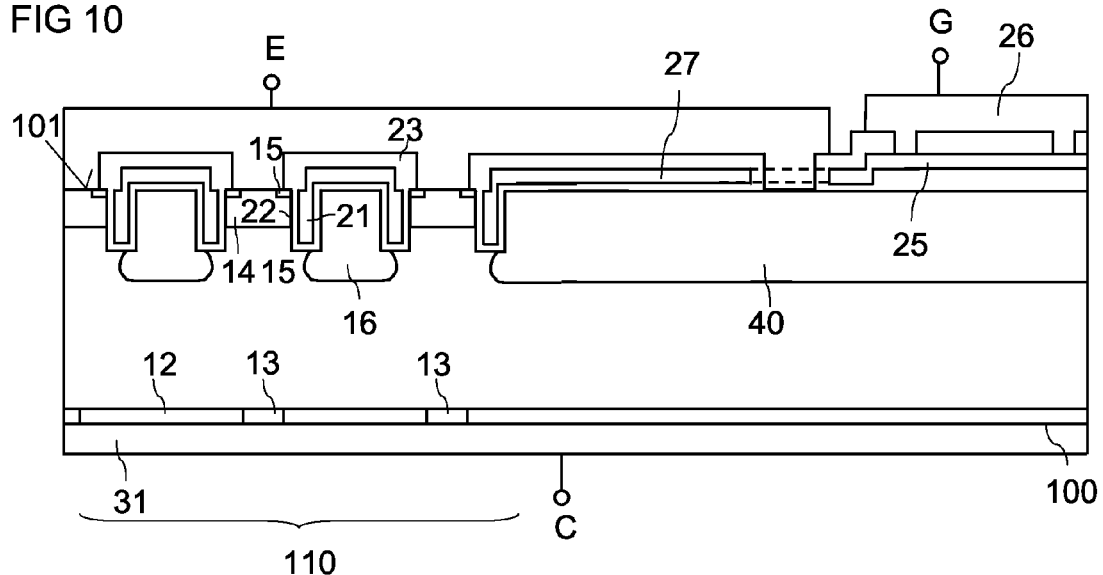
FIG. 11 illustrates a vertical cross sectional view of a semiconductor device according to a further embodiment.

FIG. 11 illustrates a vertical cross sectional view of an RC-IGBT according to a further embodiment. The cell region 110 of this RC-IGBT corresponds to the cell region explained with reference to FIG. 9. In the embodiment of FIG. 11, the parasitic region 40 is located below a gate pad or gate via 25. The gate pad or gate via 25 is electrically connected to the gate terminal G through an electrode 26. Further, the gate pad or gate via 25 is electrically connected to the gate electrode sections 21 of the individual transistor cells. In the embodiment of FIG. 11, the gate pad or gate via 25 includes an opening, where the second electrode 32 extends through the opening to the parasitic region 40. According to a further embodiment, the opening is omitted, so that the parasitic region 40 is floating (illustrated in dashed lines in FIG. 11.

In the embodiments of FIGS. 9 and 11, that include floating regions 16 of the first conductivity type, these floating regions 16 may include charge carrier lifetime reduction means. These charge carrier lifetime reduction means may correspond to the charge lifetime reduction means explained with reference to FIGS. 2 to 4.

Figure 12:
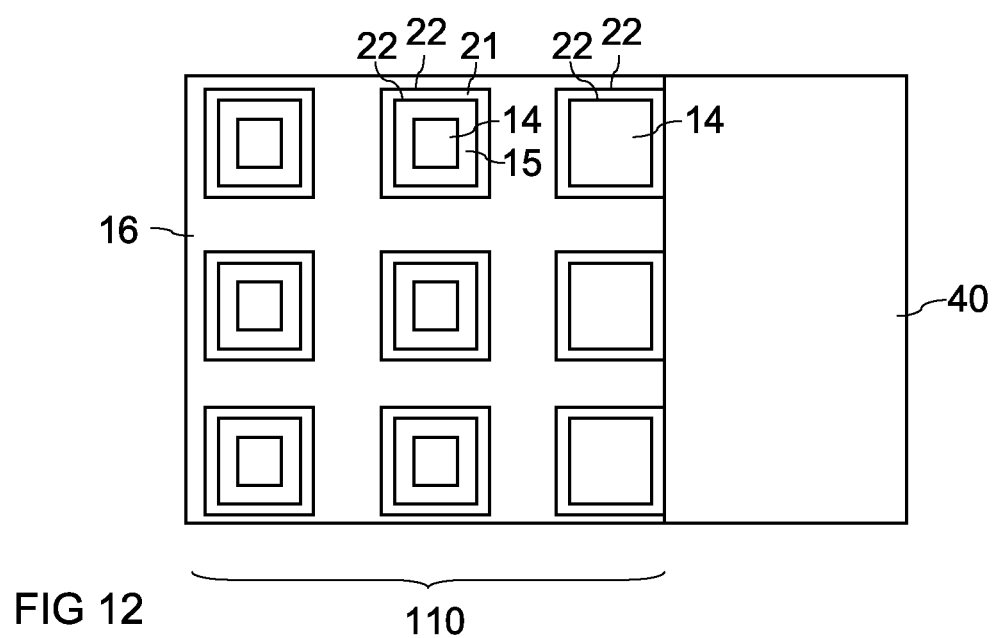
FIG. 12 illustrates a horizontal cross sectional view of an edge region of a cell region of a semiconductor device.

FIG. 12 illustrates a horizontal cross sectional view of an embodiment of the RC-IGBTs of FIGS. 9 and 11. In this embodiment, transistor cells that are close to the edge of the cell region 110 include a body region 14 but do not include a source region 15. In this embodiment, only those device cells adjoining the edge of the cell region 110 do not include a source region 15. However, this is only an example. According to a further embodiment, also device regions that are spaced apart from the edge may include device cells without source regions 15.

In the above detailed description, directional terminology, such as "top", "bottom", "front", "back", "leading", "trailing", "under", "below", "lower", "over", "upper", etc., is used with reference to the orientation of the figures being described. Because components of embodiments can be positioned in a number of different orientations, the directional terminology is used for purposes of illustration and is in no way limiting. It is to be understood that the features of the various exemplary embodiments described herein may be combined with each other, unless specifically noted otherwise.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Other embodiments may be utilized and structural or logical changes may be made without departing from the scope of the present invention. The detailed description, therefore, is not to be taken in a limiting sense. Instead, the present invention is defined and limited only by the appended claims and their legal equivalents.

What is claimed is:

1. A semiconductor device, comprising:
a first emitter region of a first conductivity type, a second emitter region of a second conductivity type complementary to the first conductivity type, a drift region of the second conductivity type, and a first electrode, the first emitter region and the second emitter region arranged between the drift region and the first electrode and each connected to the first electrode;
a cell region comprising at least one device cell, the at least one device cell comprising a body region of the first conductivity type adjoining the drift region, a source region of the second conductivity type adjoining the body region, and a gate electrode adjacent the body region and dielectrically insulated from the body region by a gate dielectric;
a second electrode electrically connected to the source region and the body region of the at least one device cell; and
a parasitic region of the first conductivity type;
wherein the parasitic region includes at least one section with charge carrier lifetime reduction means;
wherein the charge carrier lifetime reduction means is separated from the drift region by the parasitic region;
wherein the body region together with the drift region and the second emitter region form a first diode between the second electrode and the first electrode,
wherein the parasitic region together with the drift region and the second emitter region form a second diode between the second electrode and the first electrode, and
wherein a distance between the drift region and the charge carrier lifetime reduction means is such that upon applying between the first electrode and the second electrode a voltage corresponding to the voltage blocking capability of the semiconductor device a depletion region expanding in the drift region and the parasitic region does not reach the charge carrier lifetime reduction means.

2. The semiconductor device of claim 1, wherein the charge carrier lifetime reduction means is configured such that the charge carrier lifetime in the at least one section of the parasitic region is less than 100 ns.

3. The semiconductor device of claim 1, wherein the charge carrier lifetime reduction means is configured such that the charge carrier lifetime in the at least one section of the parasitic region is less than 10% of a charge carrier lifetime in the drift region.

4. The semiconductor device of claim 1, wherein a charge carrier lifetime in at least one section of the parasitic region is shorter than in the body region of the at least one transistor cell.

5. The semiconductor device of claim 1, wherein the parasitic region is electrically connected to the second electrode.

6. The semiconductor device of claim 1, wherein the parasitic region is floating.

7. The semiconductor device of claim 1, further comprising:
an edge termination structure; and
wherein the parasitic region is part of the edge termination structure.

8. The semiconductor device of claim 7, wherein the parasitic region surrounds the cell region.

9. The semiconductor device of claim 1, further comprising:
a semiconductor body in which the first and second emitter regions, the drift region, and the cell region are arranged;
a gate via or a gate pad above the semiconductor body; and
wherein the parasitic region is located below the gate via or the gate pad.

10. The semiconductor device of claim 1, wherein the charge carrier lifetime reduction means comprises recombination centers.

11. The semiconductor device of claim 10, wherein the recombination centers comprise crystal defects.

12. The semiconductor device of claim 11, wherein the crystal defects are defects induced by implanting particles into the parasitic region.

13. The semiconductor device of claim 10, wherein the recombination centers comprise heavy metal atoms.

14. The semiconductor device of claim 1, wherein the charge carrier lifetime reduction means comprise at least one recombination region.

15. The semiconductor device of claim 14, wherein the at least one recombination region is arranged in one of a trench in the parasitic region, and on top of the parasitic region.

16. The semiconductor device of claim 15, wherein the recombination region includes an electrically conductive material.

17. The semiconductor device of claim 16, wherein the electrically conductive material includes at least one of a metal or a metal-semiconductor alloy.

18. The semiconductor device of claim 17, wherein the electrically conductive material includes at least one of aluminum, copper, a metal alloy, a metal-silicon alloy, and a silicide.

19. The semiconductor device of claim 1, wherein the charge carrier lifetime reduction means comprises at least one trench in the parasitic region filled with a dielectric.

20. The semiconductor device of claim 1, further comprising:
a plurality of device cells in the cell region;
an edge region of the cell region; and
wherein device cells along the edge region of the cell region do not comprise a source region.

21. The semiconductor device of claim 1,
wherein a length of the drift region is in a current flow direction, the current flow direction being a direction in which charge carriers flow through the drift region when the semiconductor device is in an on-state, and
wherein a lateral distance between the at least one parasitic region and the second emitter region in a direction perpendicular to the current flow direction corresponds to at least the length of the drift region.

22. The semiconductor device of claim 1,
wherein the second emitter region is disposed in the cell region, and
wherein the second emitter region forms a cathode of the first diode and forms a cathode of the second diode.

* * * * *